(12) United States Patent
Otsuka et al.

(10) Patent No.: US 7,195,022 B2
(45) Date of Patent: Mar. 27, 2007

(54) PRODUCTION APPARATUS FOR PRODUCING GALLIUM NITRIDE SEMICONDUCTOR FILM AND CLEANING APPARATUS FOR EXHAUST GAS

(75) Inventors: Kenji Otsuka, Kanagawa (JP); Naoki Muranaga, Kanagawa (JP); Kikurou Takemoto, Hyogo (JP)

(73) Assignees: Japan Pionics Co., Ltd., Tokyo (JP); Sumitomo Electric Industries Ltd., Osaka (JP)

( * ) Notice: Subject to any disclaimer, the term of this patent is extended or adjusted under 35 U.S.C. 154(b) by 0 days.

(21) Appl. No.: 11/080,427

(22) Filed: Mar. 16, 2005

(65) Prior Publication Data
US 2005/0163928 A1 Jul. 28, 2005

Related U.S. Application Data

(62) Division of application No. 10/022,771, filed on Dec. 20, 2001, now abandoned.

(30) Foreign Application Priority Data
Jan. 22, 2001 (JP) ............................. 2001-12617

(51) Int. Cl.
A62D 3/00 (2006.01)
C23C 16/00 (2006.01)

(52) U.S. Cl. .................. 134/22.1; 134/22.11; 588/300; 427/255.23; 427/255.34; 427/968

(58) Field of Classification Search ............. 134/22.1, 134/22.11; 588/300; 427/255.23, 255.34, 427/968
See application file for complete search history.

(56) References Cited

U.S. PATENT DOCUMENTS

| 4,388,089 A | 6/1983 | Reif et al. |
| 4,541,844 A | 9/1985 | Malcolm |
| 5,206,002 A | 4/1993 | Skelley et al. |
| 5,955,037 A | 9/1999 | Holst et al. |
| 6,117,213 A * | 9/2000 | Ueda et al. .................... 95/273 |
| 6,156,098 A | 12/2000 | Richards |
| 6,165,272 A * | 12/2000 | Liu ............................ 118/715 |
| 6,194,628 B1 * | 2/2001 | Pang et al. .................... 96/234 |

FOREIGN PATENT DOCUMENTS

| JP | 62-218966 | 9/1987 |
| JP | 5-325872 | 12/1993 |
| JP | 2000-288342 | 10/2000 |

* cited by examiner

*Primary Examiner*—George A. Goudreau
(74) *Attorney, Agent, or Firm*—Oblon, Spivak, McClelland, Maier & Neustadt, P.C.

(57) ABSTRACT

There are disclosed a production apparatus for producing a gallium nitride semiconductor film by HVPE process, a cleaning apparatus for cleaning exhaust gas coming from the above apparatus and an overall production plant for producing a gallium nitride semiconductor by HVPE process. Therein exhaust piping for exhaust gas in the production apparatus, introduction piping for the cleaning apparatus and exhaust gas piping which connects the production apparatus and the cleaning apparatus are each composed of an electroconductive corrosion-resistant material and are each electrically grounded, thereby surely preventing electrostatic charging due to friction between ammonium chloride powders in the exhaust gas and inside walls of exhaust gas piping, and markedly enhancing operational safety.

3 Claims, 4 Drawing Sheets

PRODUCTION APPARATUS FOR PRODUCING GALLIUM NITRIDE SEMICONDUCTOR FILM AND CLEANING APPARATUS FOR EXHAUST GAS

BACKGROUND OF THE INVENTION

1. Field of the Invention

The present invention relates to a production apparatus for a gallium nitride semiconductor film, a cleaning apparatus for exhaust gas and an overall production plant for the foregoing semiconductor. More particularly, it is concerned with a production apparatus for a gallium nitride semiconductor film, a cleaning apparatus for exhaust gas and an overall production plant for the foregoing semiconductor film that are capable of preventing electrostatic charging due to ammonium chloride powders in the case of producing the gallium nitride semiconductor film.

2. Description of the Related Arts

There has been a rapid increase in recent years, in demands for a gallium nitride semiconductor film, which is a compound semiconductor as a light emitting device and photoreception device concentratedly in the field of optical communication. As a process for producing a gallium nitride semiconductor film, there are well known MOCVD (metal organic chemical vapor deposition) method which comprises reacting an organometal gas typified by trimethyl gallium as a gallium source with ammonia so that the gallium source undergoes vapor phase deposition to form a film; and HVPE (hydride vapor phase epitaxy) method which comprises reacting gallium chloride (GaCl) gas which is generated by circulating hydrogen chloride gas through metallic gallium as a gallium source, with ammonia so that the gallium source is subjected to vapor phase deposition to form a film.

In more detail, the above-mentioned HVPE method comprises synthesizing gallium chloride (GaCl) by the reaction between metallic gallium and hydrogen chloride at a temperature in the range of 800 to 1000° C., and reacting the gallium chloride thus obtained with ammonia at a temperature in the range of 800 to 1200° C. so as to subject a gallium nitride film to vapor phase deposition onto a substrate which has been arranged in advance. The vapor phase deposition is carried out usually at atmospheric pressure by means of a reaction furnace of hot wall type. Since highly corrosive hydrogen chloride is introduced in the reaction furnace at a temperature as high as 1000° C., there are generally employed as a material of construction therefor, such ceramics as quartz and the like which have excellent stability even at a high temperature and corrosion resistance.

As compared with the MOCVD method, the aforesaid HVPE method is low in the amount of ammonia gas to be used, but exhausts hydrogen gas, a slight amount of hydrogen chloride gas and a large amount of ammonium chloride powders along with a large amount of unreacted ammonia gas. Since ammonia has high toxicity as prescribed by ACGIH at a permissible concentration of 25 ppm, ammonia-containing exhaust gas which is exhausted from the reaction furnace needs to be cleaned prior to its discharge into the atmosphere.

As a method for cleaning ammonia-containing exhaust gas in a production process of a gallium nitride semiconductor film by means of the aforesaid HVPE, there are available wet absorptive method in which ammonia is neutralized by being brought into contact with an acidic aqueous solution; combustion treatment method in which ammonia is burnt by being introduced in the flame of a fuel such as propane; thermally decomposing treatment method in which ammonia is decomposed into nitrogen and hydrogen by being brought into contact with an ammonia decomposition catalyst under heating; and dry reaction method in which ammonia is cleaned through chemical reaction by being brought into contact with chemicals having chemical reactivity with ammonia; and the like method.

However, the wet absorptive method has caused a concern in that since semiconductor production equipment of atmospheric pressure system is employed in HVPE method, back diffusion of water from an acidic aqueous solution exerts adverse influence on a product.

The combustion treatment method has suffered from the disadvantage that since ammonium chloride powders bring about a fear of clogging a combustion nozzle, the powders must be disposed of in advance by using a filter or the like, where the disposal is made difficult and besides, the method has involved a fear of causing environmental pollution, since the half amount of ammonia to be treated turns into NOx.

The thermally decomposing treatment method has suffered from the disadvantage that since the amount of ammonia gas contained in exhaust gas in HVPE method is about one tenth that in MOCVD method, the production cost of an exhaust gas cleaning apparatus is relatively high, considering a small amount thereof, thus necessitating an unreasonably large installation space.

The dry reaction method has involved the problems in that since ammonium chloride powders are accumulated in the space of chemicals, thereby gradually increasing the pressure loss therethrough, the use of the chemicals is made impossible by such pressure loss before exhaustive use of the capacity of the chemicals, and also in that relatively expensive chemicals leads to a high running coat of equipment.

Under such circumstances, research and investigation have previously been made by the present inventors in order to develop an excellent cleaning apparatus free from the aforesaid shortcomings. As a result, a wet absorptive cleaning apparatus has recently been developed which is capable of preventing back diffusion of water from an acidic aqueous solution. The cleaning apparatus is that which is capable of completely preventing back diffusion of water by specifying the relationship among the cross sectional area of exhaust gas piping which connects semiconductor production equipment and a wet absorptive cleaning apparatus for exhaust gas, the length of the piping and the flow rate of the gas therein {refer to Japanese Patent Application Laid-Open No. 288342/2000}. Since an acidic aqueous solution such as hydrochloric acid is used in such a cleaning apparatus for the purpose of cleaning ammonia-containing exhaust gas, use is made of a synthetic resin having excellent corrosion resistance as a material of construction.

SUMMARY OF THE INVENTION

Although it has been generally thought that in the above-mentioned wet absorptive cleaning apparatus made of a synthetic resin, an exhaust gas which is made into a wet state prevents the occurrence of electrostatic charging, the research made by the present inventors has elucidated that electrostatic charging occurs by the friction between ammonium chloride powders and inside walls of exhaust gas passageway depending upon the conditions of exhaust gas flow rate and the like in an exhaust gas passageway on the upstream side of contact portion between the exhaust gas and the acidic aqueous solution.

Moreover, a large amount of hydrogen is used as a growth atmospheric gas in the production process for gallium nitride semiconductor film. No hazard exists provided that oxygen is not mixed in an exhaust gas passageway. However, in the case where oxygen and hydrogen coexist in a combustible range, there is a fear of explosion caused by discharge due to the dielectric breakdown of the above-mentioned electrostatic charging.

Under such circumstances, an object of the invention is to provide, regarding a production process for gallium nitride semiconductor films by means of HVPE method, a production apparatus therefor, a cleaning apparatus for exhaust gas and an overall production plant therefor which have each high safety.

Other objects of the invention will become obvious from the text of this specification hereinafter disclosed.

In such circumstances, intensive extensive research and development were accumulated by the present inventors in order to solve the above-described problems involved in the prior arts. As a result, it has been found that electrostatic charging is more likely to occur in such an exhaust gas passageway that gives rise to a high velocity of a dry exhaust gas. It has also been found that the dielectric breakdown of the electrostatic charging can certainly be prevented by constituting the above-mentioned exhaust gas passageway through the use of an electroconductive corrosion-resistant material of construction and at the same time, by electrically grounding the exhaust gas passageway. The present invention has been accomplished by the foregoing findings and information for the purpose of providing a production apparatus for a gallium nitride semiconductor film, a cleaning apparatus for exhaust gas and an overall production plant including the production apparatus and cleaning apparatus.

That is to say, the present invention is concerned with a production apparatus for producing a gallium nitride semiconductor film by subjecting gallium chloride gas as a gallium source which is generated through the circulation of hydrogen chloride gas over metallic gallium to vapor phase deposition through the reaction with ammonia so as to form a gallium nitride film, wherein an electroconductive corrosion-resistant material is used as the constructional material for exhaust piping for exhaust gas in said production apparatus, and the exhaust piping for exhaust gas is electrically grounded.

In addition, the present invention relates to a cleaning apparatus for cleaning exhaust gas coming from a production apparatus for producing a gallium nitride semiconductor film by subjecting gallium chloride gas as a gallium source which is generated through the circulation of hydrogen chloride gas over metallic gallium to vapor phase deposition through the reaction with ammonia so as to form a gallium nitride film, wherein an electroconductive corrosion-resistant material is used as the constructional material for exhaust piping for the cleaning apparatus, and the exhaust piping is electrically grounded.

Moreover, the present invention relates to an overall production plant for producing a gallium nitride semiconductor film by subjecting gallium chloride gas as a gallium source which is generated through the circulation of hydrogen chloride gas over metallic gallium to vapor phase deposition through the reaction with ammonia so as to form a gallium nitride film, wherein an electroconductive corrosion-resistant material is used as the constructional material for exhaust gas piping which connects a production apparatus for producing a gallium nitride semiconductor film and a cleaning apparatus for cleaning exhaust gas, and the exhaust gas piping is electrically grounded.

DESCRIPTION OF THE PREFERRED EMBODIMENTS

Figure 1:
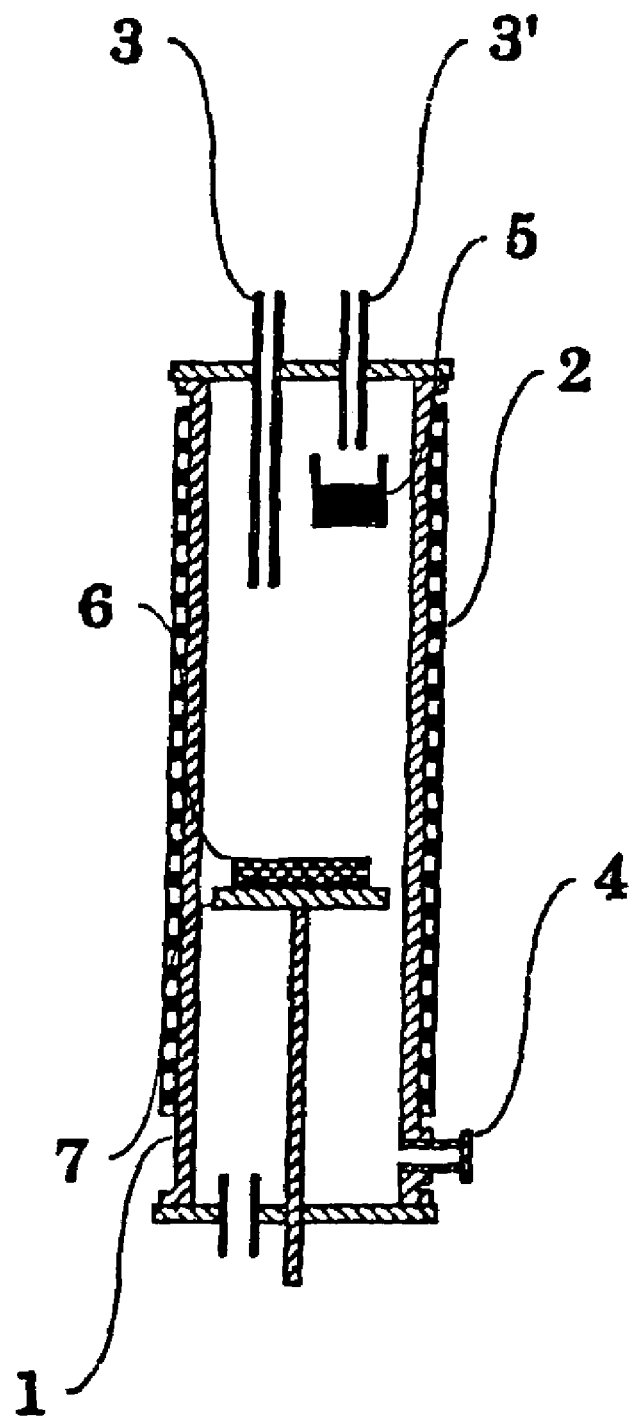
FIG. 1 is a vertical cross-sectional view showing one example of production apparatus for producing a gallium nitride semiconductor film according to the present invention.

The present invention is applied to a production apparatus for producing a gallium nitride semiconductor film by means of HVPE method, to a cleaning apparatus for cleaning exhaust gas and to an overall production plant for producing a gallium nitride semiconductor film.

The production apparatus for producing a gallium nitride semiconductor film according to the present invention is the production apparatus, wherein exhaust piping for exhaust gas is composed of an electroconductive corrosion-resistant material, and is electrically grounded.

The cleaning apparatus for cleaning exhaust gas coming from a production apparatus for producing a gallium nitride semiconductor film according to the present invention is the cleaning apparatus, wherein exhaust piping for exhaust gas is composed of an electroconductive corrosion-resistant material, and is electrically grounded.

The overall production plant for producing a gallium nitride semiconductor film according to the present invention is the production plant, wherein exhaust gas piping which connects a production apparatus for producing a gallium nitride semiconductor film and a cleaning apparatus for cleaning exhaust gas is composed of an electroconductive corrosion-resistant material, and is electrically grounded.

The electroconductive corrosion-resistant material in the production apparatus for producing a gallium nitride semiconductor film, the cleaning apparatus for cleaning exhaust gas and the overall production plant for producing the same each according to the present invention is not specifically limited provided that the material is capable of preventing dielectric breakdown of electrostatic charging which is generated by the friction between ammonium chloride powders and inside walls of an exhaust gas passageway and at the same time, is imparted with corrosion resistance against ammonia gas and the like that are contained in the exhaust gas. Such materials are exemplified by stainless steel, high nickel steel, electroconductive resins and metallic materials that are coated with an electroconductive resin and the like.

In the case where stainless steel is used as an electroconductive corrosion-resistant material, although there are usable martensite type steel and ferrite type stainless steel, it is preferable to use in view of excellent corrosion resistance, austenite type stainless steel such as SUS316 and SUS316L or austenite ferrite type stainless steel such as SUS329J1 and SUS329J2L.

The high nickel steel, which is used as one of the electroconductive corrosion-resistant material in the present invention, is a nickel steel containing at least 30% by weight of nickel, and is exemplified by inconel and hastelloy.

There are usable as an electroconductive resin in the present invention, for instance, any of various polymers which is incorporated with an electroconductive filler such as carbon black, graphite and metallic powders. Examples of such polymers include polyethylene, polypropylene, polystyrene, polyvinyl chloride, polyurethane, polyamide, polyimide, polycarbonate, polyvinylidene, phenolic resin, epoxy resin, silicone resin and fluororesin.

Of the above-exemplified polymers, are preferably usable in view of excellent corrosion resistance, polytetrafluoroethylene, tetrafluoroethylene/perfluoroalkylvinylether copolymer, tetrafluoroethylene/hexafluoropropylene copolymer, trafluoroethylene/ethylene copolymer, polychlorotrifluoroethylene, chlorotrifluoroethylene/ethylene copolymer, polyvinylidene fluoride and polyvinyl fluoride.

Examples of the metallic materials that are coated with an electroconductive resin include carbon steel, manganese steel, chromium steel, molybdenum steel, stainless steel and nickel steel, each being coated with the foregoing electroconductive resin.

The above-mentioned electroconductive corrosion-resistant materials that are used in the present invention have each a specific volume resistivity of usually at most $1 \times 10^9$ $\Omega$cm, preferably at most $1 \times 10^7$ $\Omega$cm.

In the present invention, there are no specific limitations on the methods for electrically grounding the exhaust piping for exhaust gas in the production apparatus for producing a gallium nitride semiconductor film, the exhaust piping for the cleaning apparatus for cleaning exhaust gas and exhaust gas piping which connects the production apparatus and the cleaning apparatus for exhaust gas. The electrical grounding can be carried out by means of body earth, but is preferable put into practice by installing an exclusive grounding line for the purpose of preventing, for more certainty, the discharge due to dielectric breakdown of the electrostatic charging.

In what follows, detailed description will be given of the present invention with reference to FIG. 1 to FIG. 3, which however shall never limit the present invention thereto.

FIG. 1 is a vertical cross-sectional view showing one example of production apparatus for producing a gallium nitride semiconductor film according to the present invention, wherein an electroconductive corrosion-resistant material is used as the constructional material for the exhaust piping 4 for exhaust gas, and exhaust piping 4 is electrically grounded. The exhaust gas passing through the exhaust piping 4 contains a large amount of ammonium chloride powders, and thus static electricity is generated by the friction between the powders and the inside walls of the exhaust piping 4. However, since the constructional material for the exhaust piping 4 is electroconductive, and the exhaust piping 4 is electrically grounded, it is possible to discharge the static electricity to the outside. In FIG. 1, the other symbols shall have the following designations:

1; reaction furnace, 2; heater, 3; supply piping for mixed gas of ammonia/hydrogen, 3'; supply piping for mixed gas of hydrogen chloride/hydrogen, 5; metallic gallium board, 6; substrate and 7; susceptor.

Figure 2:
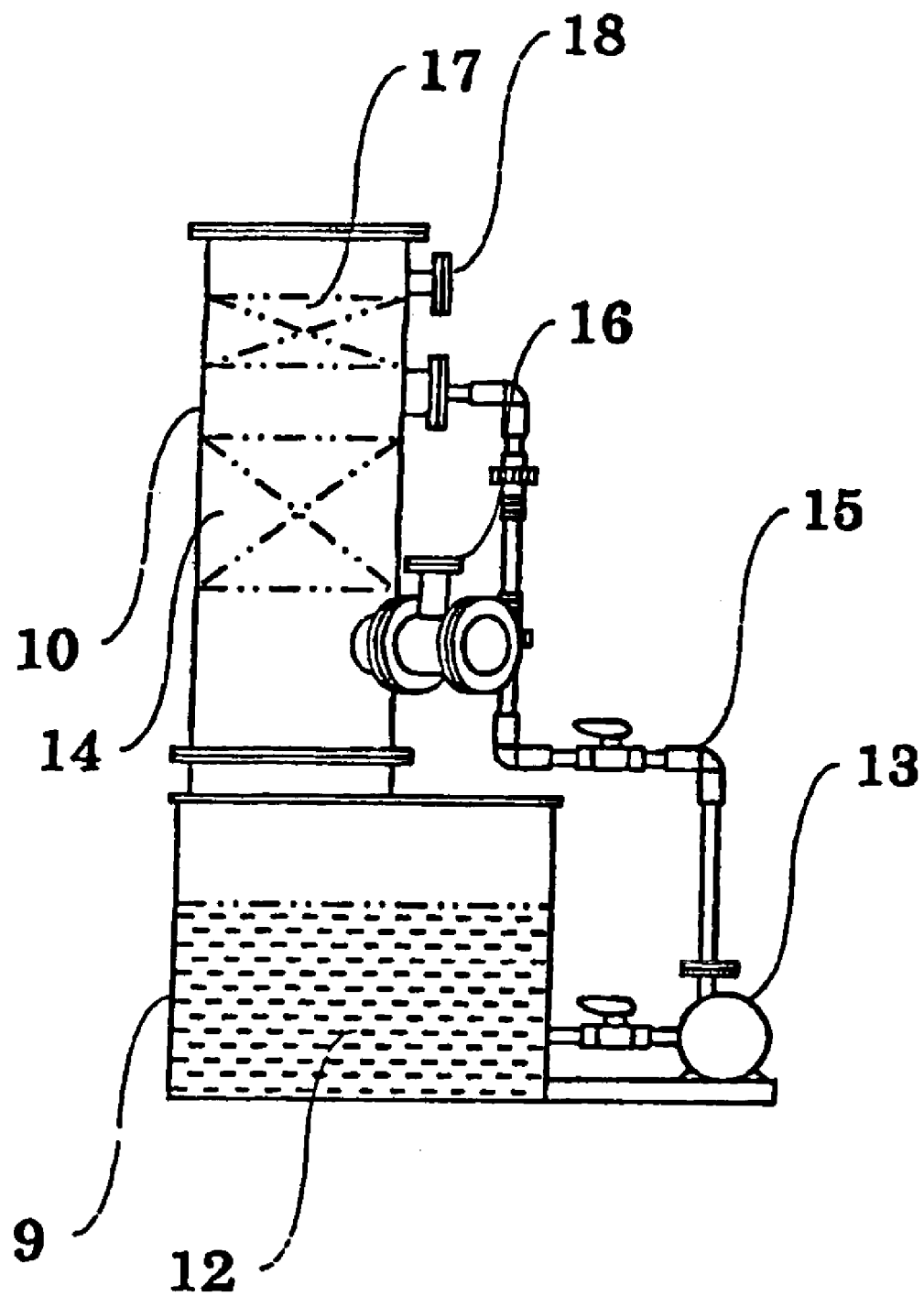
FIG. 2 is a constitutional view showing one example of cleaning apparatus for cleaning exhaust gas from a gallium nitride semiconductor film according to the present invention.

FIG. 2 is a constitutional view showing one example of cleaning apparatus for cleaning exhaust gas coming from a production apparatus for producing a gallium nitride semiconductor film according to the present invention. In this cleaning apparatus for cleaning exhaust gas in FIG. 2, electroconductive corrosion-resistant material is used as the constructional material for exhaust piping 16 for exhaust gas, and the exhaust piping 16 is electrically grounded. The exhaust gas containing a large amount of ammonium chloride powders from the production apparatus for producing a gallium nitride semiconductor film passes through the exhaust piping 16, whereby static electricity is generated by the friction between the powders and the inside walls of the exhaust piping 16. Nevertheless, since the constructional material for the exhaust piping 16 is electroconductive, and the exhaust piping 16 is electrically grounded, it is possible to discharge the static electricity to the outside.

The cleaning apparatus for cleaning exhaust gas from a gallium nitride semiconductor film in FIG. 2 illustrates wet absorptive cleaning apparatus for exhaust gas, but the cleaning apparatus according to the present invention is applicable also to other systems thereof including combustion treatment method, thermally decomposing method, dry reaction method and the like. In FIG. 2, the other symbols shall have the following designations:

9; wet absorptive cleaning apparatus, 10; absorption column, 11; spray nozzle, 12; absorption liquid, 13; pump, 14; laminated filter, 15; piping for absorption liquid circulation, 17; mist separator and 18; exhaust piping for exhaust gas in cleaning apparatus.

Figure 3:
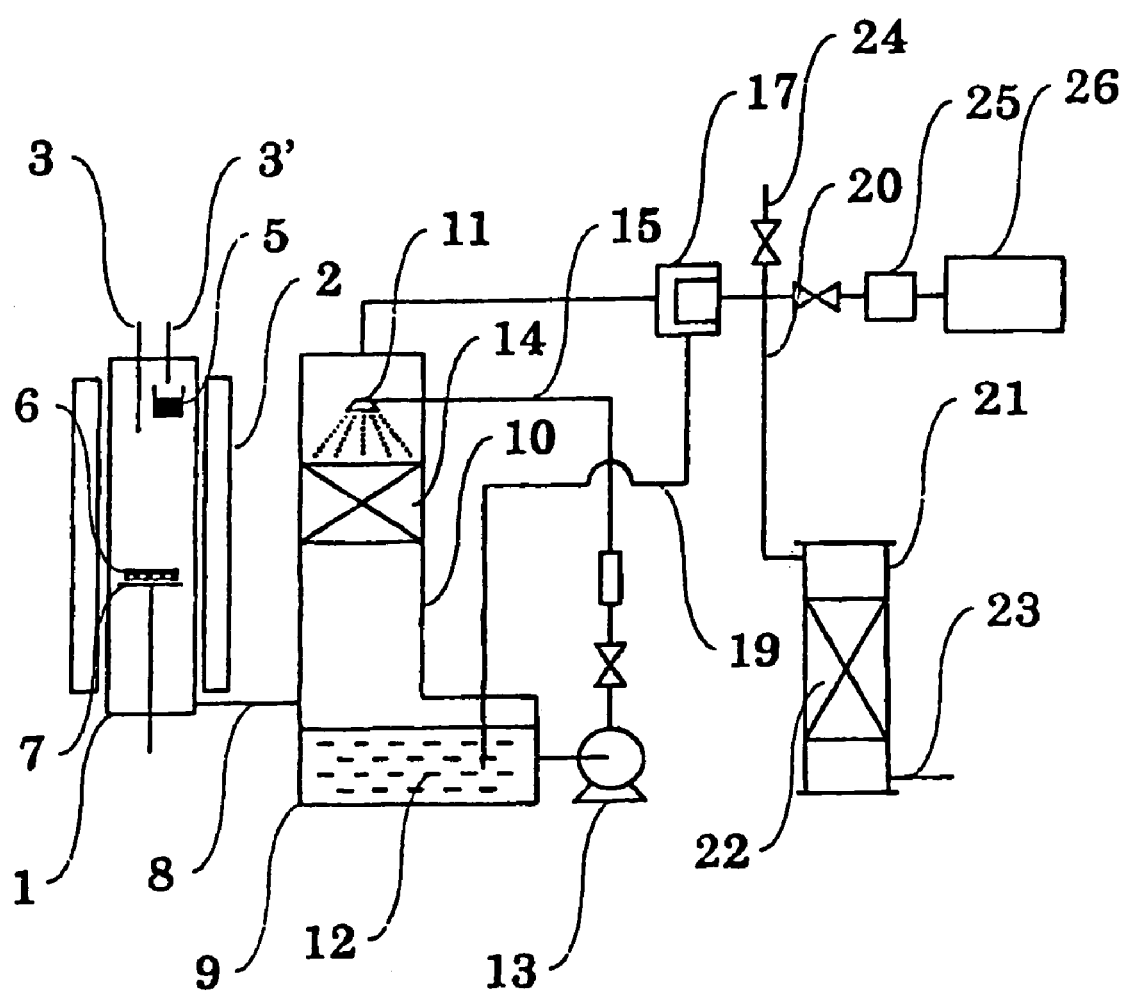
FIG. 3 is a constitutional view showing one example of overall production plant for producing a gallium nitride semiconductor film according to the present invention.

FIG. 3 is a constitutional view showing one example of overall production plant for producing a gallium nitride semiconductor film according to the present invention. In this overall production plant in FIG. 3, electroconductive corrosion-resistant material is used as the constructional material for the exhaust gas piping 8 which connects the production apparatus and the cleaning apparatus, and the exhaust gas piping 8 is electrically grounded. The exhaust gas which contains a large amount of ammonium chloride powders and which comes from the production apparatus for producing a gallium nitride semiconductor film passes through the exhaust gas piping 8, whereby static electricity is generated by the friction between the powders and inside walls of the exhaust gas piping 8. However, since the constructional material for the exhaust gas piping 8 is electroconductive, and the exhaust gas piping 8 is electrically grounded, it is possible to discharge the static electricity to the outside. In FIG. 3, the other symbols shall have the following designations:

19; return piping for mist separator, 20; inlet piping for dry cleaning column, 21; dry cleaning column, 22; dry cleaning agent, 23; exhaust gas purge line, 24; nitrogen supply piping, 25; cartridge for removing acidic vapor and 26; oxygen detector or oxygen concentration meter.

For the purpose of further enhancing the safety, it is possible to install a means for detecting oxygen or measuring the concentration thereof in the exhaust gas on any of the production apparatus for producing a gallium nitride semiconductor film, the cleaning apparatus and the overall production plant. In the case of installing the means, exhaust gas sampling is performed at a place usually from the exhaust gas passageway in the production apparatus to the outlet of exhaust gas in the cleaning apparatus.

As a means for detecting oxygen or measuring the concentration thereof in the exhaust gas, in addition to the use of an oxygen detector or an oxygen concentration meter, it is possible to detect oxygen by inhaling a sampling gas from a sampling port disposed on exhaust gas piping and the like into a detection tube which is prepared by packing an oxygen detecting agent in a transparent tube made of glass. It is also possible to detect oxygen by placing, in a bypass line of exhaust gas piping, a transparent tube which is made of glass or plastics, and which is filled in with an oxygen detecting agent. In the case of using an oxygen detector or an oxygen concentration meter in the wet absorptive cleaning apparatus for exhaust gas, in order to prevent corrosion by acidic aqueous solution, it is preferable to detect oxygen or measure the concentration thereof via a cartridge filled in with a cleaning agent which can clean the acidic vapor.

In summarizing the working effects and advantages of the present invention, by virtue of the production apparatus for producing a gallium nitride semiconductor film, the cleaning apparatus and the overall production plant each according to the present invention, it has been surely made possible to prevent discharge of static electricity generated by the friction between ammonium chloride powders and the inside walls of the exhaust piping, whereby it has been enabled to certainly prevent explosion.

In what follows, the present invention will be described in more detail with reference to comparative examples and working examples, which however shall never limit the invention thereto.

EXAMPLE 1

Preparation of a Testing Apparatus for Electrostatic Charging

Figure 4:
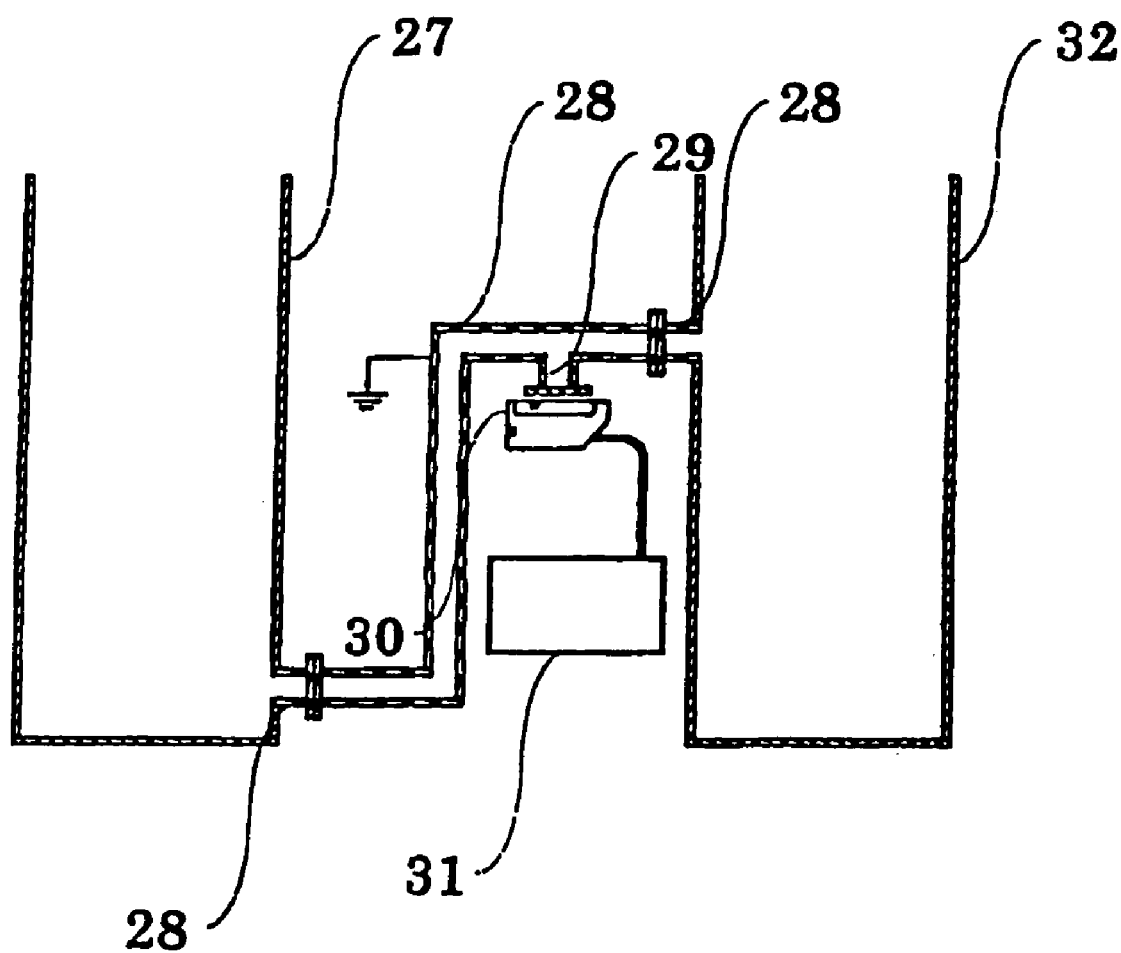
FIG. 4 is a vertical cross-sectional view showing a testing unit for electrostatic charging which was used in the working examples according to the present invention.

In order to perform electrostatic charging test for piping composed of electroconductive corrosion-resistant material in the production apparatus for producing a gallium nitride semiconductor film, the cleaning apparatus and the overall production plant, there was prepared an experimental apparatus as illustrated in FIG. 4. The experimental apparatus was of such constitution that piping 28 which had an inside diameter of 20 mm, consisted of an electroconductive corrosion-resistant material, and was connected to an electrical grounding line, was connected between a quartz tube 27 and a PVC column 32, and further that copper piping 29, a sensor head 30 and a static electricity measuring instrument 31 (manufactured by Keyence Corp. under the trade name "SK-2000") were attached to the experimental apparatus in order to measure the electrostatic charging state of the electroconductive corrosion-resistant material.

{Electrostatic Charging Test}

Ammonium chloride powders available on the market (extra pure grade, manufactured by Kanto Chemical Co., Ltd.) were pulverized for 16 hours with a mortar, and screened with a sieve having an aperture of 75 µm. Thus, the minus mesh was used as ammonium chloride powders for testing.

By using stainless steel 316 piping as piping comprising electroconductive corrosion-resistant material, dry nitrogen gas which had been prepared so as to contain 0.1 g/liter (L) of the above-prepared ammonium chloride powders was introduced in the experimental apparatus for 5 minutes through the quartz tube 27 at a flow rate of 10 L/min (superficial linear velocity LV of 53 cm/sec in the stainless steel 316 piping), during which period of time a measurement was made of electrostatic charging voltage of the piping. The result is given in Table 1.

EXAMPLE 2

The procedure in Example 1 was repeated to perform the electrostatic charging test except that the dry nitrogen gas containing the ammonium chloride powders was introduced at a flow rate of 20 L/min in place of 10 L/min (superficial linear velocity LV of 106 cm/sec in the stainless steel 316 piping). The result is given in Table 1.

EXAMPLE 3

The procedure in Example 1 was repeated to perform the electrostatic charging test except that SUS 316 piping was replaced with inconel piping. The result is given in Table 1.

EXAMPLE 4

The procedure in Example 1 was repeated to perform the electrostatic charging test except that SUS 316 piping was replaced with electroconductive resin piping which had been prepared by adding graphite to tetrafluoroethylene/perfluoroalkylvinyl ether copolymer, and which had specific volume resistivity of 100 Ωcm. The result is given in Table 1.

EXAMPLE 5

The procedure in Example 1 was repeated to perform the electrostatic charging test except that SUS 316 piping was replaced with carbon steel piping coated with the electroconductive resin as described in Example 4. The result is given in Table 1.

COMPARATIVE EXAMPLE 1

The procedure in Example 1 was repeated to perform the electrostatic charging test except that SUS 316 piping was replaced with polyvinyl chloride piping. The result is given in Table 1.

COMPARATIVE EXAMPLE 2

The procedure in Example 1 was repeated to perform the electrostatic charging test except that SUS 316 piping was replaced with polyvinyl chloride piping, and that the dry nitrogen gas containing the ammonium chloride powders was introduced at a flow rate of 20 L/min in place of 10 L/min (superficial linear velocity LV of 106 cm/sec in the polyvinyl chloride piping). The result is given in Table 1. During the test for electrostatic charging, the withstand voltage varied markedly between 0 to 15 kV or high, whereby discharge phenomenon was clearly recognized.

COMPARATIVE EXAMPLE 3

The procedure in Example 1 was repeated to perform the electrostatic charging test except that the electrical grounding line was not connected to the piping. The result is given in Table 1.

TABLE 1

| | Material of piping | Superficial linear velocity of gas (cm/s) | Ground-line | Charging voltage (Kv) |
|---|---|---|---|---|
| Example 1 | SUS316 | 53 | yes | 0 |
| Example 2 | SUS316 | 106 | yes | 0 |
| Example 3 | inconel | 53 | yes | 0 |
| Example 4 | electroconductive resin | 53 | yes | 0 |
| Example 5 | electroconductive resin/carbon steel | 53 | yes | 0 |
| Comp. Example 1 | polyvinyl chloride | 53 | yes | 12 |

TABLE 1-continued

| | Material of piping | Superficial linear velocity of gas (cm/s) | Ground-line | Charging voltage (Kv) |
|---|---|---|---|---|
| Comp. Example 2 | polyvinyl chloride | 106 | yes | 0~15 |
| Comp. Example 3 | SUS316 | 53 | no | 10 |

{Remarks}
Comp. Example: Comparative Example

What is claimed is:

1. A production method for producing a gallium nitride semiconductor film comprising the steps of:

forming a gallium nitride film by subjecting gallium chloride gas generated through the circulation of hydrogen chloride gas over metallic gallium to vapor phase deposition through the reaction with ammonia gas;

providing exhaust piping for exhaust gas, said exhaust piping being made of an electroconductive corrosion-resistant material; and electrically grounding said exhaust piping for removing electrostatic charges generated by the friction between ammonium chloride powders and inside walls of said exhaust piping.

2. A cleaning method for cleaning exhaust gas coming from a production apparatus for producing a gallium nitride semiconductor film comprising the steps of:

forming a gallium nitride film by subjecting gallium chloride gas generated through the circulation of hydrogen chloride gas over metallic gallium to vapor phase deposition through the reaction with ammonia gas;

providing exhaust piping made of an electroconductive corrosion-resistant material; and electrically grounding said exhaust piping for removing electrostatic charges generated by the friction between ammonium chloride powders and inside walls of said exhaust piping.

3. An overall production method for producing a gallium nitride semiconductor film comprising the steps of:

forming a gallium nitride film by subjecting gallium chloride gas generated through the circulation of hydrogen chloride gas over metallic gallium to vapor phase deposition through the reaction with ammonia gas;

providing exhaust gas piping which connects to a production apparatus for producing a gallium nitride semiconductor film, said exhaust piping being made of an electroconductive corrosion-resistant material;

providing a cleaning apparatus for cleaning exhaust gas; and electrically grounding said exhaust gas piping for removing electrostatic charges generated by the friction between ammonium chloride powders and inside walls of said exhaust piping.

* * * * *